(12) United States Patent
Meng

(10) Patent No.: US 9,766,510 B2
(45) Date of Patent: Sep. 19, 2017

(54) PIXEL UNIT AND ARRAY SUBSTRATE

(71) Applicant: Wuhan China Star Optoelectronics Technology Co., Ltd., Wuhan (CN)

(72) Inventor: Lin Meng, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 123 days.

(21) Appl. No.: 14/907,820

(22) PCT Filed: Dec. 21, 2015

(86) PCT No.: PCT/CN2015/098009
§ 371 (c)(1),
(2) Date: Jan. 27, 2016

(87) PCT Pub. No.: WO2017/054329
PCT Pub. Date: Apr. 6, 2017

(65) Prior Publication Data
US 2017/0235193 A1   Aug. 17, 2017

(30) Foreign Application Priority Data

Sep. 30, 2015   (CN) .......................... 2015 1 0640384

(51) Int. Cl.
*H01L 29/04*   (2006.01)
*G02F 1/1343*   (2006.01)
(Continued)

(52) U.S. Cl.
CPC .... *G02F 1/134309* (2013.01); *G02F 1/13439* (2013.01); *G02F 1/133345* (2013.01);
(Continued)

(58) Field of Classification Search
CPC . H01L 27/1222; H01L 27/124; G02F 1/1343; G02F 1/134309
(Continued)

(56) References Cited

U.S. PATENT DOCUMENTS 9,470,935 B2* 10/2016 Woo .................. G02F 1/134309
2009/0086149 A1* 4/2009 Kim .................. G02F 1/134363
349/144

(Continued)

*Primary Examiner* — Jami M Valentine
(74) *Attorney, Agent, or Firm* — Leong C. Lei

(57) ABSTRACT

The present invention provides a pixel unit and an array substrate. The pixel electrode includes four branch sections to divide the pixel zone into four display domains, helping improve the large angle color shifting problem of a display product and also simplifying the structure of the pixel electrode and making the manufacturing process simple, and facilitating the production of large-size wide-angle display products. The array substrate of the present invention is composed, in the horizontal direction, of multiple pixel units. The pixel units each include a pixel electrode that includes four branch sections to divide the pixel zone into four display domains, helping improve the large angle color shifting problem of a display product, and the pixel electrode has a simple structure to simplify the manufacturing process and facilitate the production of large-size wide-angle display products.

13 Claims, 4 Drawing Sheets

(51) Int. Cl.
*G02F 1/1335* (2006.01)
*G02F 1/1333* (2006.01)
*G02F 1/1362* (2006.01)
*H01L 27/12* (2006.01)
*H01L 29/786* (2006.01)

(52) U.S. Cl.
CPC .. *G02F 1/133512* (2013.01); *G02F 1/136286* (2013.01); *H01L 27/124* (2013.01); *H01L 27/1222* (2013.01); *H01L 29/78633* (2013.01); *H01L 29/78675* (2013.01); *G02F 2001/133357* (2013.01); *G02F 2001/134372* (2013.01); *G02F 2201/121* (2013.01); *G02F 2201/123* (2013.01); *G02F 2202/104* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2009/0213307 A1* | 8/2009 | Chiu | ................ | G02F 1/133788 |
| | | | | 349/104 |
| 2012/0314173 A1* | 12/2012 | Zhang | ............... | G02F 1/133707 |
| | | | | 349/143 |
| 2013/0010248 A1* | 1/2013 | Kang | ............... | G02F 1/133707 |
| | | | | 349/139 |
| 2013/0093987 A1* | 4/2013 | Kang | ............... | G02F 1/133707 |
| | | | | 349/141 |
| 2014/0204326 A1* | 7/2014 | Wu | .................. | G02F 1/133707 |
| | | | | 349/143 |

* cited by examiner

PIXEL UNIT AND ARRAY SUBSTRATE

BACKGROUND OF THE INVENTION

1. Field of the Invention

The present invention relates to the field of display technology, and in particular to a pixel unit and an array substrate.

2. The Related Arts

Liquid crystal displays (LCDs) have a variety of advantages, such as high brightness, high contrast, better perception of layering, vivid colors, thin device body, low power consumption, and being free of radiation, and are thus widely used in for example liquid crystal televisions, mobile phones, personal digital assistants (PDAs), digital cameras, computer monitors, and notebook computer screens, taking a leading position in the field of flat panel displays.

A liquid crystal display panel is generally made up of a color filter (CF) substrate, a thin-film transistor (TFT) array substrate, and a liquid crystal layer between the two substrates and the operation principle is that a drive voltage is applied to the two glass substrates to control liquid crystal molecules of the liquid crystal layer to rotate in order to refract out light from a backlight module to generate an image. Based on the way of orientating liquid crystal, the liquid crystal display panels of the main stream market can be classified as the following types: vertical alignment (VA), twisted nematic (TN) or super twisted nematic (STN), in-plane switching (IPS), and fringe field switching (FFS).

In the FFS type, an electric field that is generally parallel to the substrates is applied to have the liquid crystal molecules rotated in a plane that is parallel to the substrates.

To improve color shifting in a liquid crystal display panel, multi-domain techniques are commonly used, where a pixel is divided into multiple areas and the directions in which the liquid crystal of each area tilts upon application of an electric voltage is different so that the visual effect observed from all directions would be uniform and consistent.

There are many ways to realize the multi-domain technology. For a conventional FFS liquid crystal display panel, a pixel unit is generally composed of two display domains, as illustrated in FIG. 1, which is a schematic view showing a conventional pixel unit. The pixel unit comprises a pixel electrode 140, a data line 130 located leftward of the pixel electrode 140, and a gate line 110 located above the pixel electrode 140, wherein the pixel electrode 140 comprises two branch electrodes 141 that are connected to each other at a predetermined angle. One of the branch electrodes 141 has an end that is connected through a via 150 to a drain electrode of a thin-film transistor (TFT). In a pixel unit having such a structure, the data line 130 that is located leftward of the pixel electrode 140 is generally made up of two inclined sections 130 that are respectively parallel to the two branch electrode 141. The two inclined sections 131 define an apex 132 at the connection thereof. In a practical manufacturing process, a liquid crystal display panel is often conveyed by being placed on a machine so that a support pin that supports the liquid crystal display panel on the machine often rubs the liquid crystal display panel to generate static electricity. The static electricity is readily conducted to the apex 132 of the data line 130 and thus causes electrostatic damage of wiring of the liquid crystal display panel thereby resulting in damage of the liquid crystal display panel.

SUMMARY OF THE INVENTION

An object of the present invention is to provide a pixel unit that improves the issue of large angle color shifting of a display product, simplifies the manufacturing process, and enhances the quality of a large-size, wide-angle display device.

Another object of the present invention is to provide an array substrate that improves the issue of large angle color shifting of a display product, simplifies the manufacturing process, and enhances the quality of a large-size, wide-angle display device.

To achieve the above object, the present invention provides a pixel unit, which comprises a pixel zone that comprises two long edges opposite to each other and two short edges respectively connected to the two long edges, a pixel electrode arranged at a center of the pixel zone, a data line arranged alone one of the long edges of the pixel zone, and a gate line perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section.

The electrode strip comprises a smooth curve.

The electrode strip comprises a plurality of linear segments, the plurality of linear segments comprising a first slope segment starting from the connection section, a first vertical segment connected to a distal end of the first slope segment and extending toward one of the short edges of the pixel zone, a second slope segment connected to a distal end of the first vertical segment and extending toward one of the long edges of the pixel zone, a first horizontal segment connected to a distal end of the second slope segment and parallel to the short edges of the pixel zone, a third slope segment connected to a distal end of the first horizontal segment and parallel to the second slope segment, a second vertical segment connected to a distal end of the third slope segment and parallel to the first vertical segment, and a fourth slope segment connecting the second vertical segment to the connection section.

The present invention also provides an array substrate, which comprises, in a vertical direction, a backing plate, a light-shielding layer arranged on the backing plate, a buffer layer arranged on the light-shielding layer and the backing plate, a poly-silicon layer arranged on the buffer layer, a gate insulation layer arranged on the poly-silicon layer, a gate electrode and a gate line arranged on the gate insulation layer, an inter-layer insulation layer arranged on the gate electrode and the gate insulation layer, a source electrode, a drain electrode, and a data line arranged on the inter-layer insulation layer, a planarization layer arranged on the source electrode, the drain electrode, and the inter-layer insulation layer, a common electrode arranged on the planarization layer, a passivation layer arranged on the common electrode, and a pixel electrode arranged on the passivation layer;

the array substrate being divided, in a horizontal direction, into multiple pixel zones, each of the pixel zones comprising a pixel electrode, the pixel zone comprising two long edges that are opposite to each other and two short edges respectively connected to the two long edges, the data line being arranged, in the horizontal direction, along one of the long edges of the pixel zone, the gate line being arranged, in the horizontal direction, to be perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section.

The electrode strip comprises a smooth curve.

The electrode strip comprises a plurality of linear segments, the plurality of linear segments comprising a first slope segment starting from the connection section, a first vertical segment connected to a distal end of the first slope segment and extending toward one of the short edges of the pixel zone, a second slope segment connected to a distal end of the first vertical segment and extending toward one of the long edges of the pixel zone, a first horizontal segment connected to a distal end of the second slope segment and parallel to the short edges of the pixel zone, a third slope segment connected to a distal end of the first horizontal segment and parallel to the second slope segment, a second vertical segment connected to a distal end of the third slope segment and parallel to the first vertical segment, and a fourth slope segment connecting the second vertical segment to the connection section.

The inter-layer insulation layer and the gate insulation layer comprise first vias formed therein to respectively correspond to two ends of the poly-silicon layer and the source electrode and the drain electrode are respectively connected, through the first vias, to the poly-silicon layer.

The planarization layer comprises a second via formed therein to correspond to the drain electrode, the connection section of the pixel electrode being arranged in the second via and is connected to the drain electrode that is located under the second via.

The array substrate is applicable to a fringe field switching (FFS) liquid crystal display panel.

The common electrode and the pixel electrode are each formed of a material comprising indium tin oxide (ITO).

The present invention further provides an array substrate, which comprises, in a vertical direction, a backing plate, a light-shielding layer arranged on the backing plate, a buffer layer arranged on the light-shielding layer and the backing plate, a poly-silicon layer arranged on the buffer layer, a gate insulation layer arranged on the poly-silicon layer, a gate electrode and a gate line arranged on the gate insulation layer, an inter-layer insulation layer arranged on the gate electrode and the gate insulation layer, a source electrode, a drain electrode, and a data line arranged on the inter-layer insulation layer, a planarization layer arranged on the source electrode, the drain electrode, and the inter-layer insulation layer, a common electrode arranged on the planarization layer, a passivation layer arranged on the common electrode, and a pixel electrode arranged on the passivation layer;

the array substrate being divided, in a horizontal direction, into multiple pixel zones, each of the pixel zones comprising a pixel electrode, the pixel zone comprising two long edges that are opposite to each other and two short edges respectively connected to the two long edges, the data line being arranged, in the horizontal direction, along one of the long edges of the pixel zone, the gate line being arranged, in the horizontal direction, to be perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section;

wherein the inter-layer insulation layer and the gate insulation layer comprise first vias formed therein to respectively correspond to two ends of the poly-silicon layer and the source electrode and the drain electrode are respectively connected, through the first vias, to the poly-silicon layer;

wherein the planarization layer comprises a second via formed therein to correspond to the drain electrode, the connection section of the pixel electrode being arranged in the second via and is connected to the drain electrode that is located under the second via;

wherein the array substrate is applicable to a fringe field switching (FFS) liquid crystal display panel; and wherein the common electrode and the pixel electrode are each formed of a material comprising indium tin oxide (ITO).

The efficacy of the present invention is that the present invention provides a pixel unit and an array substrate. The pixel electrode comprises four branch sections to divide the pixel zone into four display domains, helping improve the large angle color shifting problem of a display product and also simplifying the structure of the pixel electrode and making the manufacturing process simple, and facilitating the production of large-size wide-angle display products. The array substrate of the present invention is composed, in the horizontal direction, of multiple pixel units. The pixel units each comprise a pixel electrode that comprises four branch sections to divide the pixel zone into four display domains, helping improve the large angle color shifting problem of a display product, and the pixel electrode has a simple structure to simplify the manufacturing process and facilitate the production of large-size wide-angle display products.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
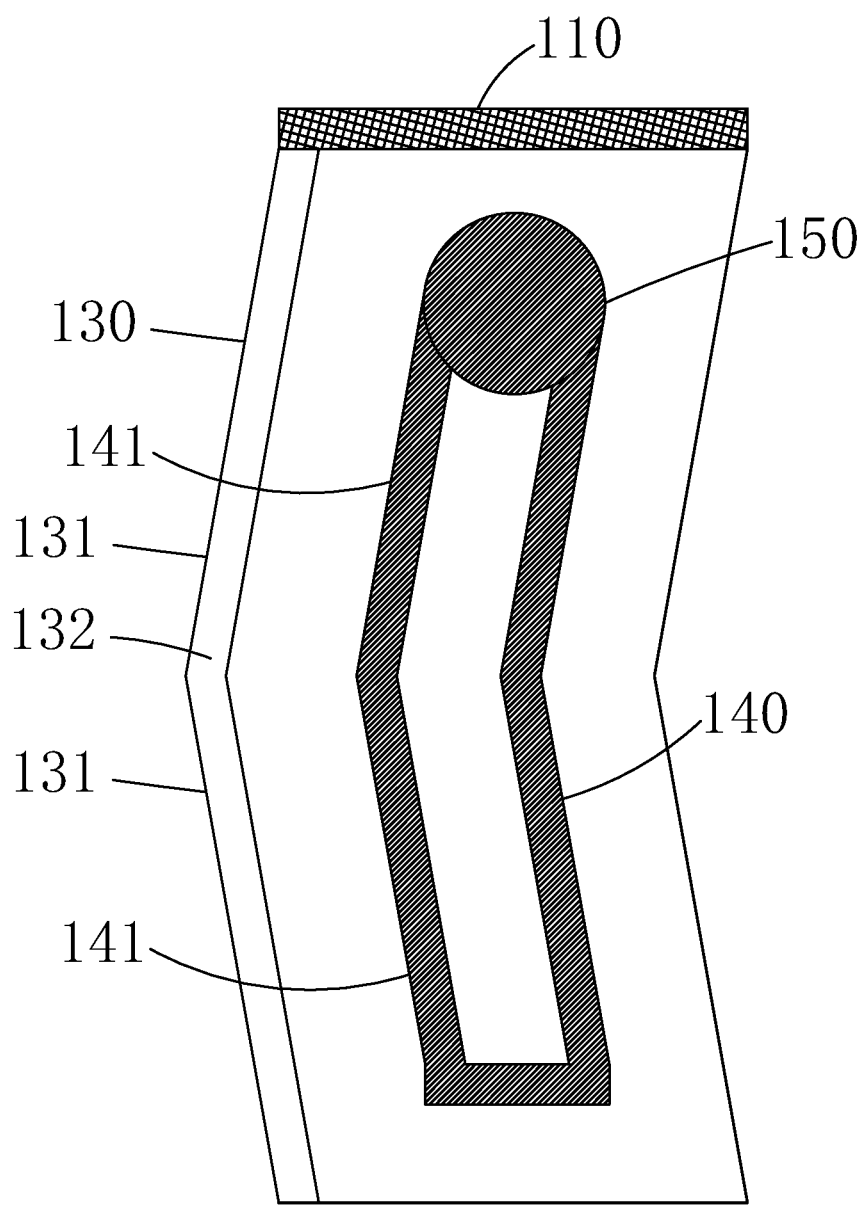
FIG. 1 is a schematic view illustrating the structure of a conventional pixel unit.
Figure 2:
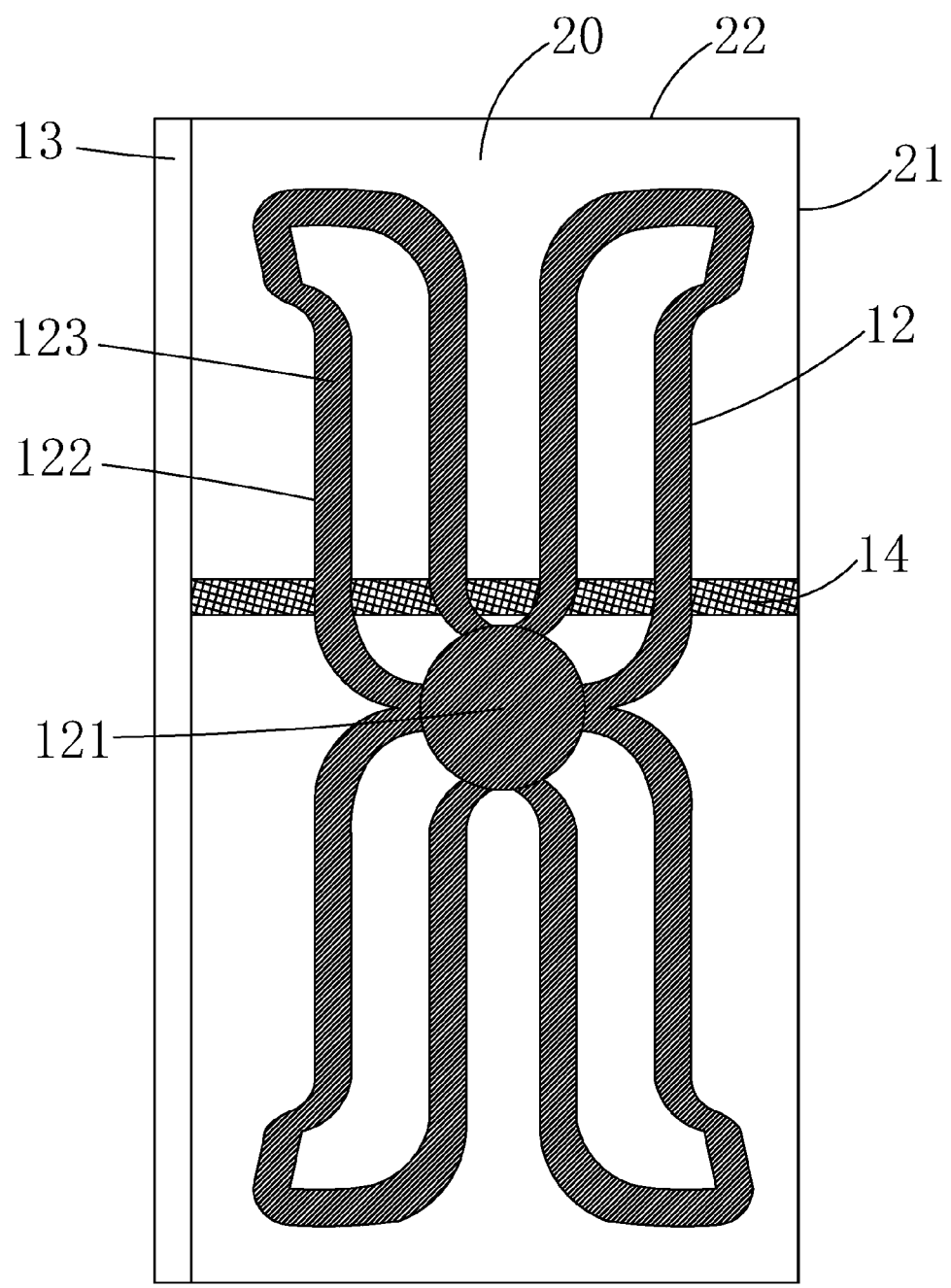
FIG. 2 is a schematic view illustrating the structure of a pixel unit according to a first embodiment of the present invention.
Figure 3:
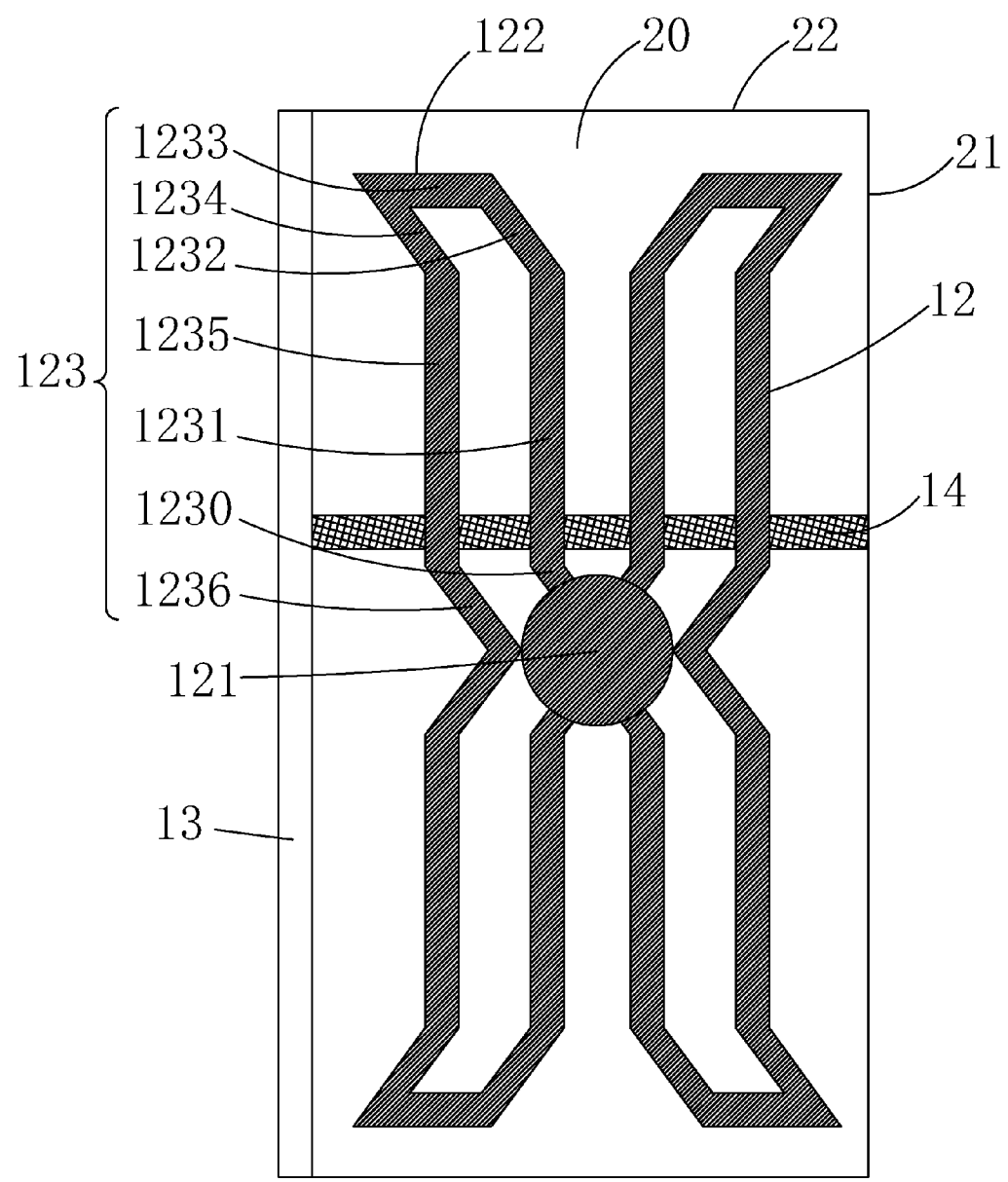
FIG. 3 is a schematic view illustrating the structure of a pixel unit according to a second embodiment of the present invention.

Referring to FIGS. 2-3, firstly, the present invention provides a pixel unit, which comprises two opposite long edges 21 and two opposite short edges 22 that surround and collectively delimit a pixel zone 20, a pixel electrode 12 arranged at a center of the pixel zone 20, a data line 13 arranged alone one of the long edges 21 of the pixel zone 20, and a gate line 14 perpendicular to the data line 13 and extending through the pixel electrode 12.

The pixel electrode 12 comprises a connection section 121 located at a center thereof and four branch sections 122 extending from the connection section 121 to a perimeter of the pixel zone 20. The four branch sections 122 are symmetric, in a top-bottom direction and a left-right direction, with respect to straight lines that extend through the connection section 121 and are respectively parallel to the long edges 21 and the short edges 22 of the pixel zone 20. The branch sections 122 each start from the connection section 121, then extend in a direction, which is parallel to the long edges 21 of the pixel zone 20, toward the short edges 22 of the pixel zone 20, and further extend toward the long edges 21 of the pixel zone 20 at a location close to the short edges 22 of the pixel zone 20; wherein each of the branch sections 122 comprises an electrode strip 123 that is of a closed form having a starting point and an ending point both coincident with the connection section 121.

As shown in FIG. 2, a first embodiment of the pixel unit of the present invention is illustrated. In the embodiment, the electrode strip 123 is composed of a smooth curve.

As shown in FIG. 3, a second embodiment of the pixel unit of the present invention is illustrated. In the embodiment, the electrode strip 123 is composed of a plurality of linear segments. The plurality of linear segments comprises a first slope segment 1230 starting from the connection section 121, a first vertical segment 1231 connected to a distal end of the first slope segment 1230 and extending toward a short edge 22 of the pixel zone 2, a second slope segment 1232 connected to a distal end of the first vertical segment 1231 and extending toward a long edge 21 of the pixel zone 20, a first horizontal segment 1233 connected to a distal end of the second slope segment 1232 and parallel to the short edges 22 of the pixel zone 20, a third slope segment 1234 connected to a distal end of the first horizontal segment 1233 and parallel to the second slope segment 1232, a second vertical segment 1235 connected to a distal end of the third slope segment 1234 and parallel to the first vertical segment 1231, and a fourth slope segment 1236 connecting the second vertical segment 1235 to the connection section 121.

The present invention provides a pixel unit, which comprises a pixel electrode having four branch sections to divide the pixel zone into four display domains, helping improve the large angle color shifting problem of a display product and also simplifying the structure of the pixel electrode and making the manufacturing process simple, and facilitating the production of large-size wide-angle display products.

Figure 4:
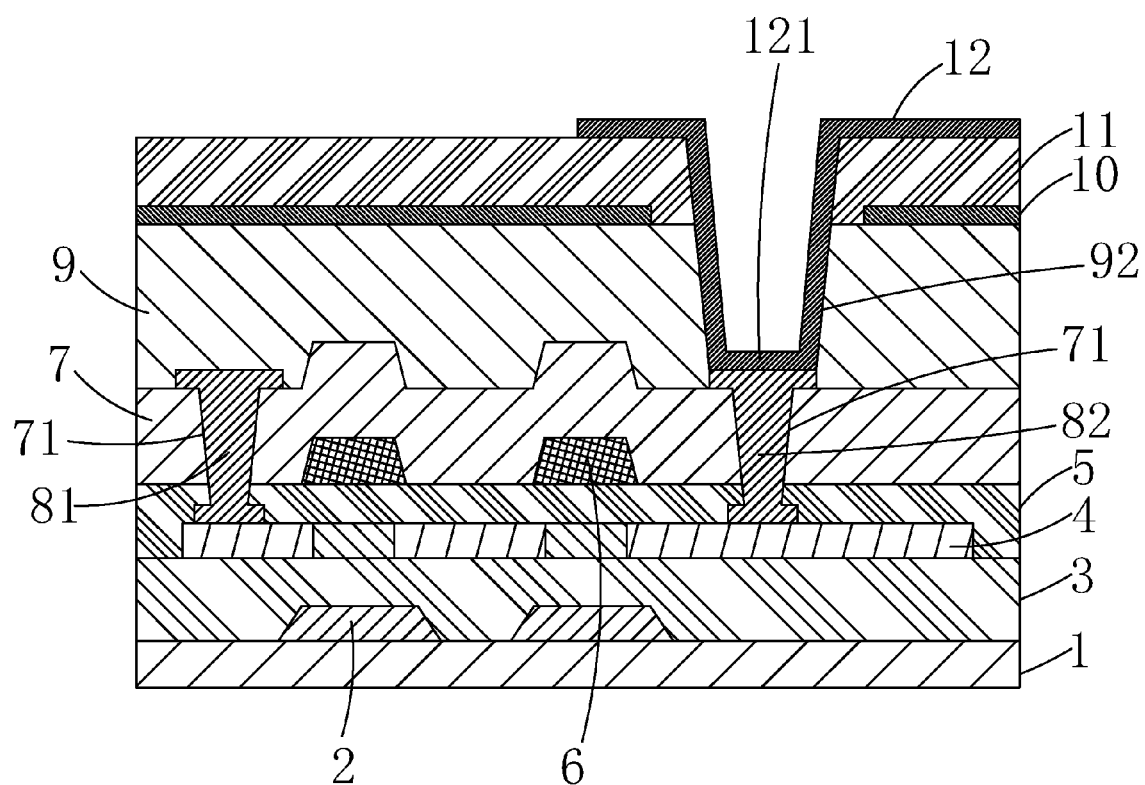
FIG. 4 is a schematic view illustrating the structure of an array substrate according to the present invention.

Referring to FIG. 4, with additional reference to FIGS. 2-3, the present invention also provides an array substrate that comprises the above-described pixel unit. The array substrate comprises, in a vertical direction, a backing plate 1, a light-shielding layer 2 arranged on the backing plate 1, a buffer layer 3 arranged on the light-shielding layer 2 and the backing plate 1, a poly-silicon layer 4 arranged on the buffer layer 3, a gate insulation layer 5 arranged on the poly-silicon layer 4, a gate electrode 6 and a gate line 14 arranged on the gate insulation layer 5, an inter-layer insulation layer 7 arranged on the gate electrode 6 and the gate insulation layer 5, a source electrode 81, a drain electrode 82, and a data line 13 arranged on the inter-layer insulation layer 7, a planarization layer 9 arranged on the source electrode 81, the drain electrode 82, and the inter-layer insulation layer 7, a common electrode 10 arranged on the planarization layer 9, a passivation layer 11 arranged on the common electrode 10, and a pixel electrode 12 arranged on the passivation layer 11.

As shown in FIGS. 2-3, the array substrate is divided, in the horizontal direction, into multiple pixel zones 20. Each of the pixel zones 20 comprises a pixel electrode 12 arranged therein, and the pixel zone 20 is circumferentially surrounded and delimited by two long edges 21 that are opposite to each other and two short edges 22 that are opposite to each other. The data line 13 is arranged, in the horizontal direction, along one of the long edges 21 of the pixel zone 20 and the gate line 14 is arranged, in the horizontal direction, to be perpendicular to the data line 13 and extending through the pixel electrode 12.

The pixel electrode 12 comprises a connection section 121 located at a center thereof and four branch sections 122 extending from the connection section 121 to a perimeter of the pixel zone 20. The four branch sections 122 are symmetric, in a top-bottom direction and a left-right direction, with respect to straight lines that extend through the connection section 121 and are respectively parallel to the long edges 21 and the short edges 22 of the pixel zone 20. The branch sections 122 each start from the connection section 121, then extend in a direction, which is parallel to the long edges 21 of the pixel zone 20, toward the short edges 22 the pixel zone 20, and further extend toward the long edges 21 of the pixel zone 20 at a location close to the short edges 22 of the pixel zone 20; wherein each of the branch sections 122 comprises an electrode strip 123 that is of a closed form having a starting point and an ending point both coincident with the connection section 121.

As shown in FIG. 2, a first embodiment of the pixel unit of the present invention is illustrated. In the embodiment, the electrode strip 123 is composed of a smooth curve.

As shown in FIG. 3, a second embodiment of the pixel unit of the present invention is illustrated. In the embodiment, the electrode strip 123 is composed of a plurality of linear segments. The plurality of linear segments comprises a first slope segment 1230 starting from the connection section 121, a first vertical segment 1231 connected to a distal end of the first slope segment 1230 and extending toward a short edge 22 of the pixel zone 2, a second slope segment 1232 connected to a distal end of the first vertical segment 1231 and extending toward a long edge 21 of the pixel zone 20, a first horizontal segment 1233 connected to a distal end of the second slope segment 1232 and parallel to the short edges 22 of the pixel zone 20, a third slope segment 1234 connected to a distal end of the first horizontal segment 1233 and parallel to the second slope segment 1232, a second vertical segment 1235 connected to a distal end of the third slope segment 1234 and parallel to the first vertical segment 1231, and a fourth slope segment 1236 connecting the second vertical segment 1235 to the connection section 121.

Specifically, the inter-layer insulation layer 7 and the gate insulation layer 5 comprise first vias 71 formed therein to respectively correspond to two ends of the poly-silicon layer 4. The source electrode 81 and the drain electrode 82 are respectively connected, through the first vias 71, to the poly-silicon layer 4.

Specifically, the planarization layer 9 comprises a second via 92 formed therein to correspond to the drain electrode 82. The connection section 121 of the pixel electrode 12 is arranged in the second via 92 and is connected to the drain electrode 82 that is located under the second via 92.

Specifically, the array substrate of the present invention is applicable to a fringe field switching (FFS) liquid crystal display panel.

Specifically, the backing plate 1 is a glass plate.

The light-shielding layer 2 is formed of a material comprising metals.

The buffer layer 3, the gate insulation layer 5, the inter-layer insulation layer 7 are each formed of a material comprising silicon oxide ($SiO_x$), silicon nitride ($SiN_x$), or a combination thereof.

The gate electrode 6, the gate line 14, the source electrode 81, the drain electrode 82, and the data line 13 are each formed of a material comprising one of molybdenum (Mo), titanium (Ti), aluminum (Al), and copper (Cu) or a stacked combination of multiple ones thereof.

The planarization layer 9 is formed of a material comprising an organic substance.

The common electrode 10 and the pixel electrode 12 are each formed of a material comprising ITO (indium tin oxide).

The present invention provides an array substrate, which is composed, in the horizontal direction, of multiple pixel units. The pixel units each comprise a pixel electrode that comprises four branch sections to divide the pixel zone into four display domains, helping improve the large angle color shifting problem of a display product, and the pixel electrode has a simple structure to simplify the manufacturing process and facilitate the production of large-size wide-angle display products.

In summary, the present invention provides a pixel unit and an array substrate. The pixel electrode comprises four branch sections to divide the pixel zone into four display domains, helping improve the large angle color shifting problem of a display product and also simplifying the structure of the pixel electrode and making the manufacturing process simple, and facilitating the production of large-size wide-angle display products. The array substrate of the present invention is composed, in the horizontal direction, of multiple pixel units. The pixel units each comprise a pixel electrode that comprises four branch sections to divide the pixel zone into four display domains, helping improve the large angle color shifting problem of a display product, and the pixel electrode has a simple structure to simplify the manufacturing process and facilitate the production of large-size wide-angle display products.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A pixel unit, comprising a pixel zone that comprises two long edges opposite to each other and two short edges respectively connected to the two long edges, a pixel electrode arranged at a center of the pixel zone, a data line arranged alone one of the long edges of the pixel zone, and a gate line perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section.

2. The pixel unit as claimed in claim 1, wherein the electrode strip comprises a smooth curve.

3. The pixel unit as claimed in claim 1, wherein the electrode strip comprises a plurality of linear segments, the plurality of linear segments comprising a first slope segment starting from the connection section, a first vertical segment connected to a distal end of the first slope segment and extending toward one of the short edges of the pixel zone, a second slope segment connected to a distal end of the first vertical segment and extending toward one of the long edges of the pixel zone, a first horizontal segment connected to a distal end of the second slope segment and parallel to the short edges of the pixel zone, a third slope segment connected to a distal end of the first horizontal segment and parallel to the second slope segment, a second vertical segment connected to a distal end of the third slope segment and parallel to the first vertical segment, and a fourth slope segment connecting the second vertical segment to the connection section.

4. An array substrate, comprising, in a vertical direction, a backing plate, a light-shielding layer arranged on the backing plate, a buffer layer arranged on the light-shielding layer and the backing plate, a poly-silicon layer arranged on the buffer layer, a gate insulation layer arranged on the poly-silicon layer, a gate electrode and a gate line arranged on the gate insulation layer, an inter-layer insulation layer arranged on the gate electrode and the gate insulation layer, a source electrode, a drain electrode, and a data line arranged on the inter-layer insulation layer, a planarization layer arranged on the source electrode, the drain electrode, and the inter-layer insulation layer, a common electrode arranged on the planarization layer, a passivation layer arranged on the common electrode, and a pixel electrode arranged on the passivation layer;

the array substrate being divided, in a horizontal direction, into multiple pixel zones, each of the pixel zones comprising a pixel electrode, the pixel zone comprising two long edges that are opposite to each other and two short edges respectively connected to the two long edges, the data line being arranged, in the horizontal direction, along one of the long edges of the pixel zone, the gate line being arranged, in the horizontal direction, to be perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section.

5. The array substrate as claimed in claim 4, wherein the electrode strip comprises a smooth curve.

6. The array substrate as claimed in claim 4, wherein the electrode strip comprises a plurality of linear segments, the plurality of linear segments comprising a first slope segment starting from the connection section, a first vertical segment connected to a distal end of the first slope segment and extending toward one of the short edges of the pixel zone, a second slope segment connected to a distal end of the first vertical segment and extending toward one of the long edges of the pixel zone, a first horizontal segment connected to a distal end of the second slope segment and parallel to the short edges of the pixel zone, a third slope segment connected to a distal end of the first horizontal segment and parallel to the second slope segment, a second vertical segment connected to a distal end of the third slope segment and parallel to the first vertical segment, and a fourth slope segment connecting the second vertical segment to the connection section.

7. The array substrate as claimed in claim 4, wherein the inter-layer insulation layer and the gate insulation layer comprise first vias formed therein to respectively correspond to two ends of the poly-silicon layer and the source electrode and the drain electrode are respectively connected, through the first vias, to the poly-silicon layer.

8. The array substrate as claimed in claim 4, wherein the planarization layer comprises a second via formed therein to correspond to the drain electrode, the connection section of the pixel electrode being arranged in the second via and is connected to the drain electrode that is located under the second via.

9. The array substrate as claimed in claim 4, wherein the array substrate is applicable to a fringe field switching (FFS) liquid crystal display panel.

10. The array substrate as claimed in claim 4, wherein the common electrode and the pixel electrode are each formed of a material comprising indium tin oxide (ITO).

11. An array substrate, comprising, in a vertical direction, a backing plate, a light-shielding layer arranged on the backing plate, a buffer layer arranged on the light-shielding layer and the backing plate, a poly-silicon layer arranged on the buffer layer, a gate insulation layer arranged on the poly-silicon layer, a gate electrode and a gate line arranged on the gate insulation layer, an inter-layer insulation layer arranged on the gate electrode and the gate insulation layer, a source electrode, a drain electrode, and a data line arranged on the inter-layer insulation layer, a planarization layer arranged on the source electrode, the drain electrode, and the inter-layer insulation layer, a common electrode arranged on the planarization layer, a passivation layer arranged on the common electrode, and a pixel electrode arranged on the passivation layer;

the array substrate being divided, in a horizontal direction, into multiple pixel zones, each of the pixel zones comprising a pixel electrode, the pixel zone comprising two long edges that are opposite to each other and two short edges respectively connected to the two long edges, the data line being arranged, in the horizontal direction, along one of the long edges of the pixel zone, the gate line being arranged, in the horizontal direction, to be perpendicular to the data line and extending through the pixel electrode;

the pixel electrode comprising a connection section located at a center thereof and four branch sections extending from the connection section to a perimeter of the pixel zone, the four branch sections being symmetric, in a top-bottom direction and a left-right direction, with respect to straight lines that extend through the connection section and are respectively parallel to the long edges and the short edges of the pixel zone, the branch sections each starting from the connection section, then extending in a direction, which is parallel to the long edges of the pixel zone, toward the short edges of the pixel zone, and further extending toward the long edges of the pixel zone at a location close to the short edges of the pixel zone, wherein each of the branch sections comprises an electrode strip that is of a closed form having a starting point and an ending point both coincident with the connection section;

wherein the inter-layer insulation layer and the gate insulation layer comprise first vias formed therein to respectively correspond to two ends of the poly-silicon layer and the source electrode and the drain electrode are respectively connected, through the first vias, to the poly-silicon layer;

wherein the planarization layer comprises a second via formed therein to correspond to the drain electrode, the connection section of the pixel electrode being arranged in the second via and is connected to the drain electrode that is located under the second via;

wherein the array substrate is applicable to a fringe field switching (FFS) liquid crystal display panel; and wherein the common electrode and the pixel electrode are each formed of a material comprising indium tin oxide (ITO).

12. The array substrate as claimed in claim 11, wherein the electrode strip comprises a smooth curve.

13. The array substrate as claimed in claim 11, wherein the electrode strip comprises a plurality of linear segments, the plurality of linear segments comprising a first slope segment starting from the connection section, a first vertical segment connected to a distal end of the first slope segment and extending toward one of the short edges of the pixel zone, a second slope segment connected to a distal end of the first vertical segment and extending toward one of the long edges of the pixel zone, a first horizontal segment connected to a distal end of the second slope segment and parallel to the short edges of the pixel zone, a third slope segment connected to a distal end of the first horizontal segment and parallel to the second slope segment, a second vertical segment connected to a distal end of the third slope segment and parallel to the first vertical segment, and a fourth slope segment connecting the second vertical segment to the connection section.

* * * * *